(12) United States Patent
Furumiya

(10) Patent No.: US 6,667,499 B1
(45) Date of Patent: Dec. 23, 2003

(54) SOLID-STATE IMAGE SENSING DEVICE AND METHOD OF MANUFACTURING THE SAME

(75) Inventor: Masayuki Furumiya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/699,383

(22) Filed: Oct. 31, 2000

(30) Foreign Application Priority Data

Nov. 4, 1999 (JP) .......................................... 11-314384

(51) Int. Cl.[7] ................................................ H01L 29/74
(52) U.S. Cl. .......................... 257/225; 257/48; 257/215
(58) Field of Search ................................. 257/232, 233, 257/432, 225, 228, 414, 431–436, 48, 256, 257, 258, 215

(56) References Cited

U.S. PATENT DOCUMENTS 5,234,868 A * 8/1993 Cote
6,072,191 A * 6/2000 La et al.
6,188,094 B1 * 2/2001 Kochi et al.

* cited by examiner

Primary Examiner—Nathan J. Flynn
Assistant Examiner—Kevin Quinto
(74) Attorney, Agent, or Firm—Sughrue Mion, PLLC

(57) ABSTRACT

A solid-state image sensing device includes a semiconductor substrate, insulating film, electrode/interconnection, light-shielding film, planarizing film, microlens, and film thickness measuring pattern. The substrate has an image sensing region where elements including photodiodes are formed and a monitor region for film thickness measurement. The insulating film is formed on the entire substrate surface. The electrode/interconnection is selectively formed in the image sensing region on the substrate via the insulating film. The light-shielding film having an opening corresponding to a photodiode is formed in the image sensing region on the electrode/interconnection via the insulating film. The planarizing film is formed in the image sensing region on the light-shielding film and insulating film. The microlens is formed on the planarizing film in correspondence with the photodiode and opening. The film thickness measuring pattern formed in the monitor region includes a first multi-layered structure formed from the insulating film, electrode/interconnection, light-shielding film, and planarizing film. A method of manufacturing this device is also disclosed.

7 Claims, 9 Drawing Sheets

SOLID-STATE IMAGE SENSING DEVICE AND METHOD OF MANUFACTURING THE SAME

BACKGROUND OF THE INVENTION

The present invention relates to an on-chip microlens for a solid-state image sensing device and, more particularly, to a solid-state image sensing device which allows checking whether the film thickness of a planarizing film for the microlens of an image sensing section is formed as designed, and a method of manufacturing the same.

Development of solid-state image sensing devices is now in full flourish for image input cameras of personal computers video cameras as well as for video cameras. As the solid-state image sensing devices become popular, the required performance is advanced, and an increase in number of pixels and downsizing are essential subjects in development. For example, for digital still cameras that are becoming popular in recent years, the number of pixels increases from 330,000 pixels (640 dots×480 dots) to 1,300,000 pixels (1,280 dots×1,024 dots). Recently, digital still cameras with 2,000,000 pixels are available. As for downsizing in 330,000-pixel cameras, the mainstream is changing from ⅓-inch format (5.5 mm in diagonal size) to ¼-inch format (4 mm in diagonal size).

With such an increase in number of pixels and downsizing of solid-state image sensing devices, reduction of pixel size is inevitable. In the above-described 330,000-pixel cameras, the pixel size is about 6.8 μm per side of a pixel in the ⅓-inch format, while it is 5.0 μm per side of a pixel in the ¼-inch format. When the pixel size is reduced, the amount of incident light decreases, resulting in deterioration in sensitivity. More specifically, the S/N (Signal-to-Noise) ratio lowers, and the image quality becomes poor. Hence, how to maintain the sensitivity high even with a reduced pixel size is a problem. To solve this problem, conventionally, an on-chip microlens is formed on a photodiode.

Before an explanation of an on-chip microlens, a conventional interline CCD (Charge Coupled Device) image sensing device will be described.

FIG. 4 shows a general interline CCD image sensing device. The CCD image sensing device comprises a rectangular image sensing region 51, a horizontal CCD 52 extending in the row direction on the lower side of the image sensing region 51, and an output section (charge detection section) 53 connected to one end of the horizontal CCD 52. In the image sensing region 51, a plurality of photodiodes 54 for photoelectrically converting light into signal charges and storing the charges are arranged in a two-dimensional matrix. A vertical CCD 55 for transferring signal charges is arranged adjacent to each photodiode array while extending in the column direction. A read region 56 is formed between each photodiode 54 and a corresponding vertical CCD 55 to read signal charges from the photodiode 54 to the vertical CCD 55. The region other than the above components in the image sensing region 51 is an element isolation region 57. The portion other than the image sensing region 51, horizontal CCD 52, and output section 53 is a field region 58.

In such a CCD image sensing device, a p-type well 2 is formed on an n-type substrate 1 constructing the image sensing section, as shown in FIG. 5A. In the p-type well 2, an n-type photodiode layer 3 for storing signal charges generated upon photoelectric conversion, an n-type vertical CCD buried layer 4 for vertically transferring the charges, a read region 56 for reading the charges from the n-type photodiode layer 3 to the vertical CCD buried layer 4, and a heavily-doped p-type impurity layer 6 serving as an element isolation region are formed. The heavily-doped p-type impurity layer 6 is formed in the element isolation region between the photodiode layer 3 and the vertical CCD buried layer 4 and on the surface of the photodiode layer 3. A p-type vertical CCD well layer 5 is formed under the vertical CCD buried layer 4. A vertical CCD transfer electrode 16 is formed on the vertical CCD buried layer 4 via an insulating film 15. A light-shielding film 17 having an opening 18 above the photodiode layer 3 is formed on the insulating film 15 which is formed on the entire surface of the semiconductor substrate including the vertical CCD buried layer 4 and heavily-doped p-type impurity layer 6.

A planarizing film 20 is formed on the insulating film 15 and light-shielding film 17. A microlens 19 is formed on the planarizing film 20 in correspondence with the opening 18. The microlens 19 optically acts as a convex lens to condense incident light 21 onto the photodiode layer 3 through the opening 18, thereby improving the photosensitivity. Referring to FIG. 5A, the planarizing film 20 is illustrated as if it were formed from a uniform material.

For a color image sensing device, a predetermined color layer 22 is formed in the planarizing film 20 in units of pixels, as shown in FIG. 5B. The color layer 22 extracts a color of light incident on the photodiode layer 3 constituting a pixel. That is, the planarizing film 20 is not always formed from a uniform material and may include, e.g., a color layer of a color filter or an internal lens with a refractive index different from that of the planarizing film. Note that a layer between the surface of the opening 18 and the bottom surface of the microlens 19, which is optically transparent or passes a specific color and includes the color layer 22, is sometimes simply called a planarizing film 20.

A method of manufacturing the conventional image sensing device will be described next with reference to FIGS. 6A to 6E. First, as shown in FIG. 6A, with a general semiconductor manufacturing process, the above-described p-type well 2, n-type photodiode layer 3, n-type vertical CCD buried layer 4, p-type vertical CCD well layer 5, and heavily-doped p-type impurity layer 6 are formed on the surface of the n-type semiconductor substrate 1 constituting the image sensing section, and then, the insulating film 15 is formed on the entire substrate surface. Next, as shown in FIG. 6B, the vertical CCD transfer electrode 16, insulating film 15, light-shielding film 17, and opening 18 are sequentially formed on the insulating film 15, thus completing the underlying structure of the image sensing device. The structure shown in FIG. 6B will be referred to as an underlying structure or underlying pattern.

An on-chip microlens is formed next. Referring to FIG. 6C, the planarizing film 20 made of an acrylic resin is formed (coated) on the underlying structure of the image sensing device formed in the semiconductor manufacturing process. For a single-CCD color image sensing device, the predetermined color layer 22 is inserted into the planarizing film 20 in units of pixels. As the color layer 22, a color layer formed from a pigment material or a color layer formed from a dye material is used. For an image sensing device other than a single-CCD color device, the color layer 22 may be absent. To keep the planarity after formation of the color layer 22, planarizing films may be repeatedly formed (coated) a plurality of number of times.

After that, as shown in FIG. 6D, a resin pattern 9 is formed on the planarizing film 20 in correspondence with the opening 18 as a microlens formation region by patterning a resin made of an acrylic material using lithography. Next, as shown in FIG. 6E, the resin pattern 9 is worked into a convex lens shape having a predetermined curvature using thermal reflow, thereby forming the microlens 19. Thus, the image sensing device is completed.

The microlens 19 must have a shape that wholly condenses the incident light 21 to the opening 18 for its purpose. Hence, in forming the microlens 19, the film thickness of the planarizing film 20 and the height and width (diameter) of the microlens 19 are appropriately determined in advance by optical simulations or the like. Additionally, in the manufacturing process, for the film thickness of the planarizing film 20 or the height of the microlens 19, formation is done while monitoring the film thickness of the coated acrylic resin and confirming that the film thickness is appropriate using, e.g., another semiconductor wafer substrate or glass substrate. Finally, in forming the convex lens surface of the microlens 19, the surface is formed by reflow under appropriate temperature and time management.

In the manufacturing process of such an image sensing device, the film thickness of the planarizing film for the microlens is monitored in the following way. First, before coating the planarizing film 20 on the semiconductor wafer substrate having the underlying structure of the image sensing device, a resin for a planarizing film is coated on a semiconductor wafer substrate or glass substrate called a monitor substrate having no underlying structure. Next, the film thickness of the coated resin is monitored by measuring the step from the substrate by a step meter using a probe.

However, the planarizing film cannot normally be formed by one coating process, and resin coating need be performed a plurality of number of times. More specifically, for the large recess at the photodiode formation portion, the resin is patterned to fill the recess. In addition, to even interconnections in the underlying structure, the resin is coated a plurality of number of times. Furthermore, to form a color filter, the film thickness is slightly changed in units of colors. For this reason, even when one wants to monitor the final film thickness of the planarizing film by monitoring the film thickness on the monitor substrate for every resin coating process, the actual planarizing film thickness formed on the image sensing device substrate is different from the film thickness of the planarizing film on the monitor substrate, degrading the monitor reliability.

If the film thickness of a resultant planarizing film is deviated from the design value, the planarizing film is removed and re-formed before formation of the microlens (convex lens). However, since the reliability of monitored film thickness of the planarizing film is low, the film thickness error may not be recognized. In this case, the film thickness error of the planarizing film is not determined until the microlens is formed for a final product, and errors in electrooptic characteristics are detected by actual drive inspection of the image sensing device.

Actual drive inspection of an image sensing device is executed in units of chips, and testing of inspection is time-consuming. For this reason, when the microlens error is recognized in this inspection process for the first time, the TAT (Turn-Around-Time) of the manufacturing process increases because the enormous testing time has been consumed so far, resulting in large loss in the manufacturing process.

SUMMARY OF THE INVENTION

It is an object of the present invention to provide a solid-state image sensing device capable of accurately monitoring the film thickness of a planarizing film for a microlens and a method of manufacturing the same.

In order to achieve the above object, according to the present invention, there is provided a solid-state image sensing device comprising a semiconductor substrate having an image sensing region where elements including a plurality of photoelectric conversion elements are formed and a monitor region for film thickness measurement, an insulating film formed on an entire surface of the semiconductor substrate, an electrode/interconnection selectively formed in the image sensing region on the semiconductor substrate via the insulating film, a light-shielding film formed in the image sensing region on the electrode/interconnection via the insulating film, the light-shielding film having an opening corresponding to the photoelectric conversion element, a planarizing film formed in the image sensing region on the light-shielding film and insulating film, a microlens formed on the planarizing film in correspondence with the photoelectric conversion element and the opening of the light-shielding film, and a film thickness measuring pattern formed in the monitor region and including a first multilayered structure formed from the insulating film, electrode/interconnection, light-shielding film, and planarizing film.

DESCRIPTION OF THE PREFERRED EMBODIMENTS

The present invention will be described below in detail with reference to the accompanying drawings.

Figure 1A:
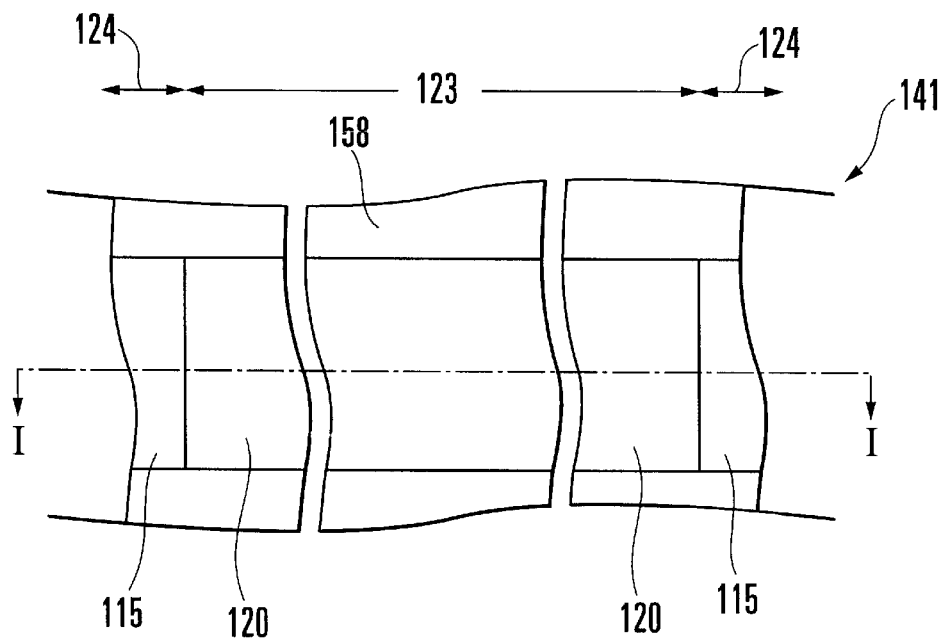
FIG. 1A is a plan view showing the film thickness measuring pattern of a planarizing film in an image sensing device according to the first embodiment of the present invention.
Figure 1B:
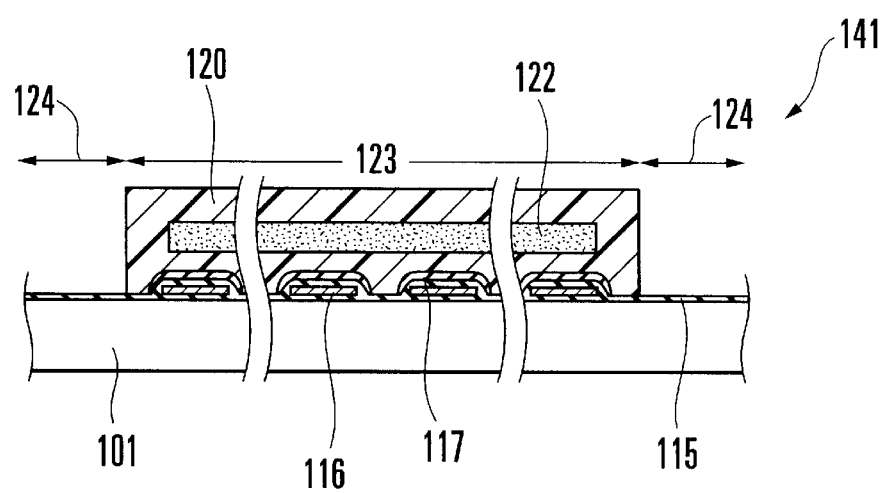
FIG. 1B is a sectional view taken along a line I—I in FIG. 1A.

FIGS. 1A and 1B show the film thickness measuring pattern of a planarizing film for the microlens of an image sensing device according to the first embodiment of the present invention. FIG. 1A shows the planar positional relationship between an insulating film and a planarizing film which construct a film thickness measuring pattern.

Referring to FIG. 1A, a film thickness measuring pattern is formed in a field region 158 other than the image sensing region, horizontal CCD, and output section (charge detection section). The field region 158 does not always indicate only a portion having a thick oxide film and may be a portion with a thin oxide film. The film thickness measuring pattern is formed in a region 123 has the same underlying portion (underlying pattern) as that of the image sensing section. More specifically, as shown in FIG. 1B, the same structure as that of the image sensing section, i.e. a vertical CCD transfer electrode 116 formed from polysilicon, an interlevel insulating film 115, and a light shielding film 117 formed from a metal film are formed in the region 123. A planarizing film 120 similar to the planarizing film of the image sensing section is formed on the underlying portion. For a color image sensing device, a color layer 122 and planarizing film 120 are formed on the planarizing film 120.

Since the same planarizing film 120 and color layer 122 as those in the image sensing section are formed on the same underlying pattern as that in the image sensing section in the region 123, the film thickness of the planarizing film 120 formed in the film thickness measuring pattern is the same as that of the planarizing film in the image sensing section. For this reason, when the film thickness of the planarizing film 120 in the film thickness measuring pattern is measured, the film thickness of the planarizing film in the image sensing section can be accurately monitored.

To measure the film thickness of the planarizing film 120, a film thickness meter having a probe is used. For measurement, a reference height for the film thickness meter is necessary. For this purpose, a region 124 having neither the underlying pattern nor the planarizing film 120 is formed partially around the planarizing film 120 where a film thickness measuring pattern 141 is formed. The region 124 is formed in the following manner. After the microlens is formed on the planarizing film in the image sensing section, the region around the film thickness measuring pattern is partially etched by the etching process of removing the resin on the bonding pad. Thus, the film thickness of the planarizing film in the image sensing section can be accurately monitored by measuring, using the film thickness meter having a probe, the height of the region 123 where the planarizing film 120 is formed, with reference to the height of the surface of the region 124 where the resin which should form the planarizing film 120 is etched.

As is apparent from FIG. 1B, the reference surface (the surface of the region 124) is almost flush with the photodiode surface or the insulating film surface on the photodiode. For this reason, when the film thickness of the planarizing film 120 in the film thickness measuring pattern 141 is monitored, it can be determined whether the film thickness of the planarizing film in the image sensing section matches the design value.

In this embodiment, as shown in FIG. 1A, the region 124 in the film thickness measuring pattern 141, where neither the underlying pattern nor the planarizing film are formed, is formed on both sides of the underlying monitor region 123. This is because the film thickness meter having a probe measures while moving the probe in a straight direction. More specifically, if the measurement reference height is provided only at one portion, an error occurs in the measured height between the start point and the end point of the probe. When the reference height is provided on both sides of the film thickness measuring pattern 141, as described above, the start and end points are set at the reference height on both sides. For this reason, even when the probe changes in the direction of height, the reliability of measured height data can be increased by standardizing the heights at the start and end points to 0.

Figure 2A:
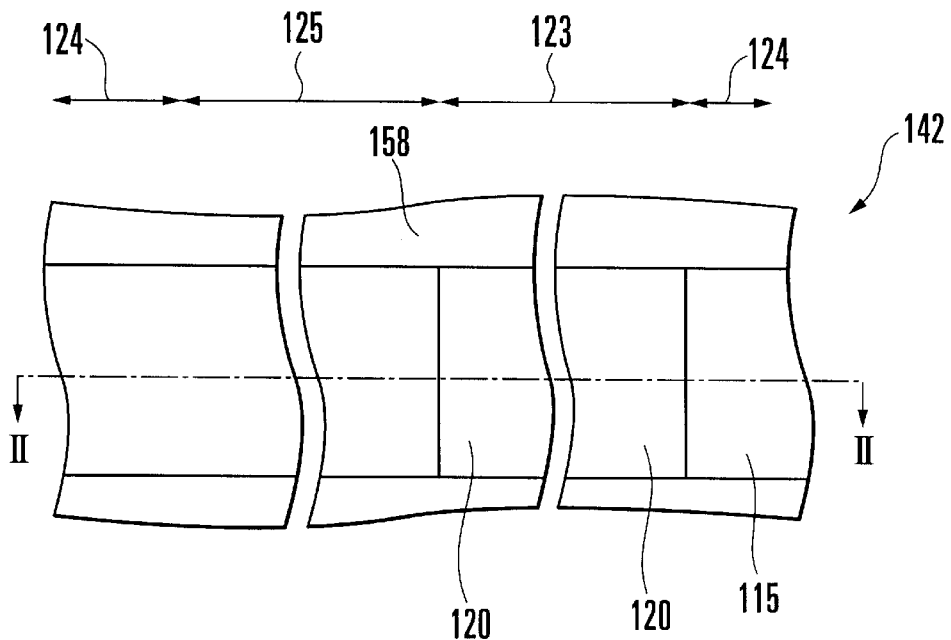
FIG. 2A is a plan view showing the film thickness measuring pattern of a planarizing film in an image sensing device according to the second embodiment of the present invention.
Figure 2B:
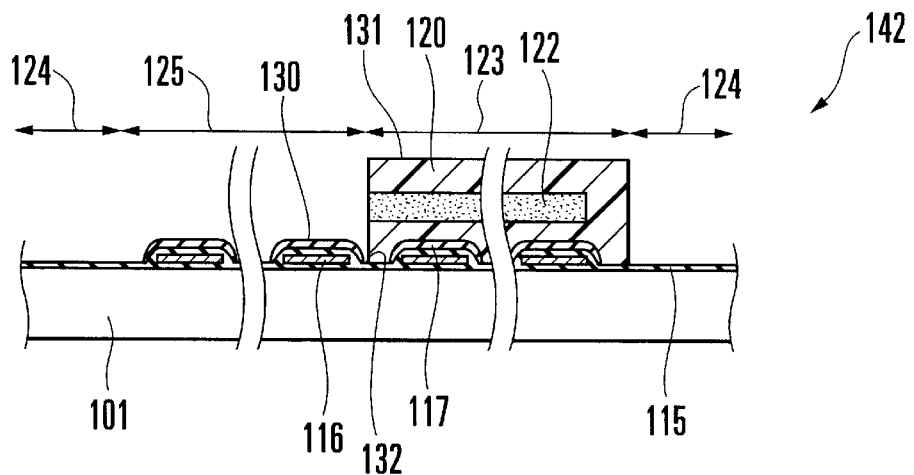
FIG. 2B is a sectional view taken along a line II—II in FIG. 2A.

FIGS. 2A and 2B show a film thickness measuring pattern according to the second embodiment of the present invention.

A film thickness measuring pattern 142 of this embodiment is different from the film thickness measuring pattern 141 of the first embodiment in that a planarizing film 120 is not formed not only in a region 124 where the same underlying pattern as that of the image sensing section is not formed but also in a region 125 of regions 123 and 125 having the same underlying pattern as that in the image sensing section. With this structure, the film thickness from an underlying pattern uppermost portion 130 to a planarizing film uppermost portion 131 can also be known. For this reason, it can also be determined whether the resin layer could be normally buried on the underlying pattern uppermost portion 130 and an insulating film surface 132 on the photodiode surface (the recessed bottom surface of the photodiode portion).

FIGS. 3A to 3G show a method of manufacturing an image sensing device including the film thickness measuring pattern 141 shown in FIGS. 1A and 1B. Referring to FIGS. 3A to 3G, steps in manufacturing the film thickness measuring pattern of the planarizing film in the monitor region are shown on the left side, and corresponding steps in manufacturing the image sensing section in the image sensing region are shown on the right side.

Figure 3A:
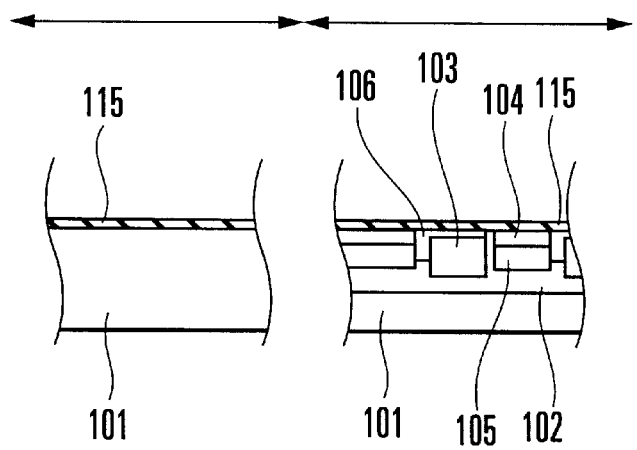
FIGS. 3A to 3G are sectional views showing steps in manufacturing the image sensing device having the film thickness measuring pattern shown in FIGS. 1A and 1B.
Figure 3B:
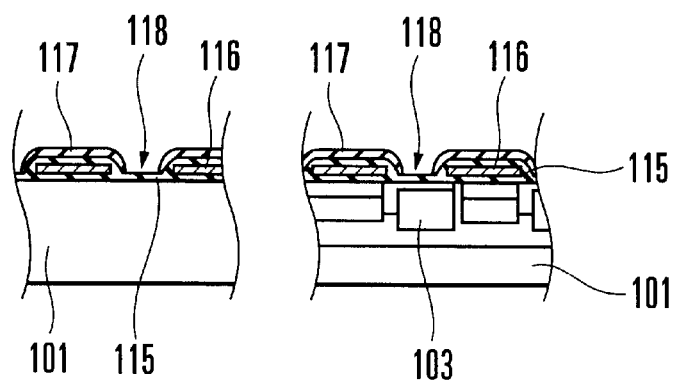

First, as shown in FIGS. 3A and 3B, the same underlying pattern as in the image sensing region is formed in the monitor region. At this time, wells 102 and 105, photodiode layer 103, CCD buried layer 104, and impurity layer 106 are formed in the image sensing region, though they need not be formed in the monitor region. This is because the impurity profile in the substrate, which is irrelevant to the unevenness, is irrelevant to the film thickness measuring pattern 141.

The underlying pattern formed from the same diffusion layer as in the image sensing region may be formed in the monitor region. In this embodiment, a light-shielding film 117 is formed on an insulating film 115. However, the light-shielding film 117 may be formed between a plurality of interlevel insulating films forming the insulating film 115.

Figure 3C:
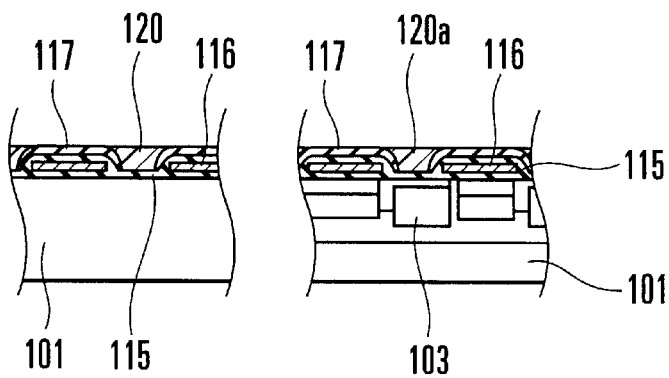

A resin for a planarizing film is coated on the underlying pattern. The coated resin is patterned and etched to bury a first planarizing film 120a in only the recess in an opening 118 corresponding to the photodiode layer 103, as shown in FIG. 3C.

Figure 3D:
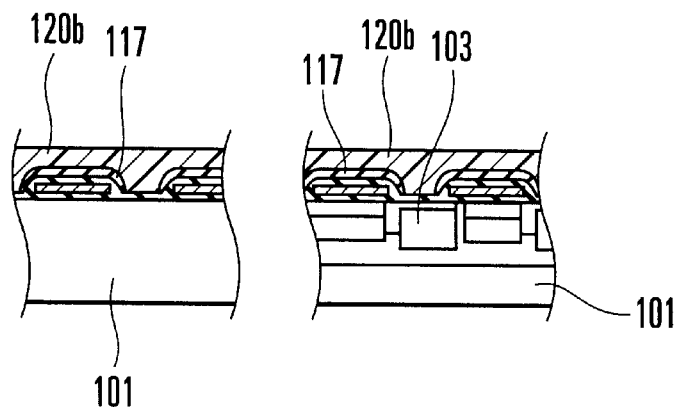
Figure 3E:
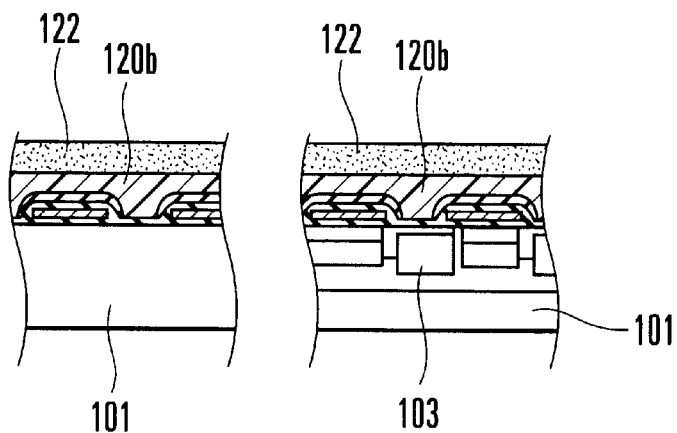

As shown in FIG. 3D, a second planarizing film 120b is further formed on the substrate. The second planarizing film 120b is formed integrally with the first planarizing film 120a without patterning. In this process, the second planarizing film 120b may be further buried in the recess of the opening 118, like the first planarizing film 120a or may even interconnections in the image sensing region. For a color image sensing device, a color layer 122 is formed by patterning in units of pixels, as shown in FIG. 3E.

Figure 3F:
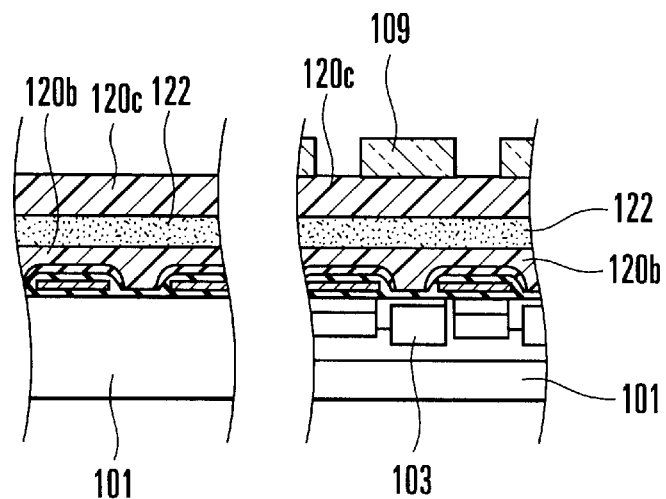

As shown in FIG. 3F, to improve the planarity in the image sensing region, a third planarizing film 120c is formed on the color layer 122. For a device other than a color image sensing device, or when the planarity is excellent even for a color image sensing device, the third planarizing film 120c may not be formed. Subsequently, a resin pattern 109 for a microlens is formed in the image sensing region.

Figure 3G:
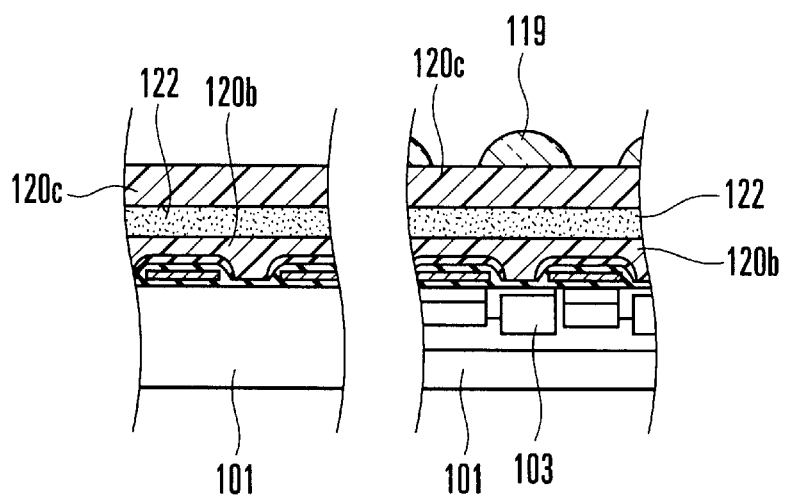
Figure 4:
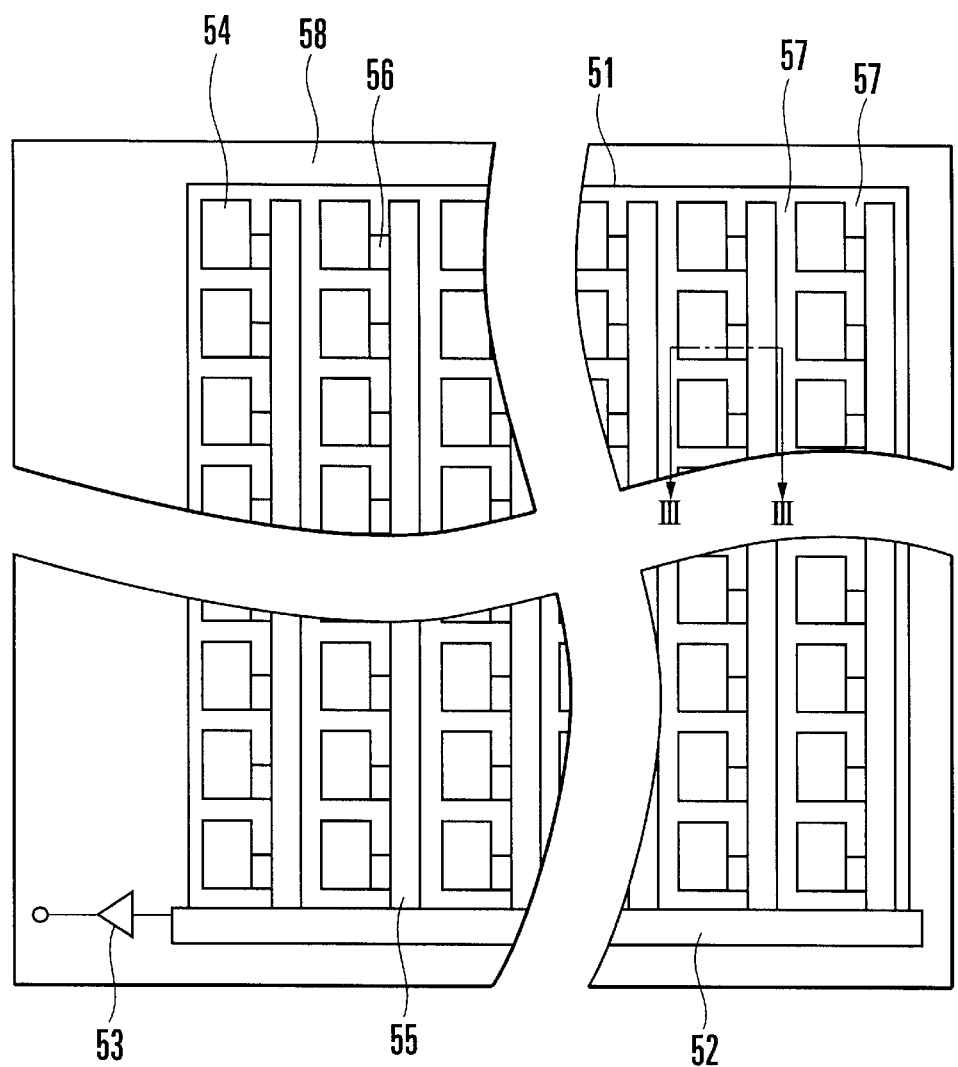
FIG. 4 is a plan view showing an interline CCD image sensing device.
Figure 5A:
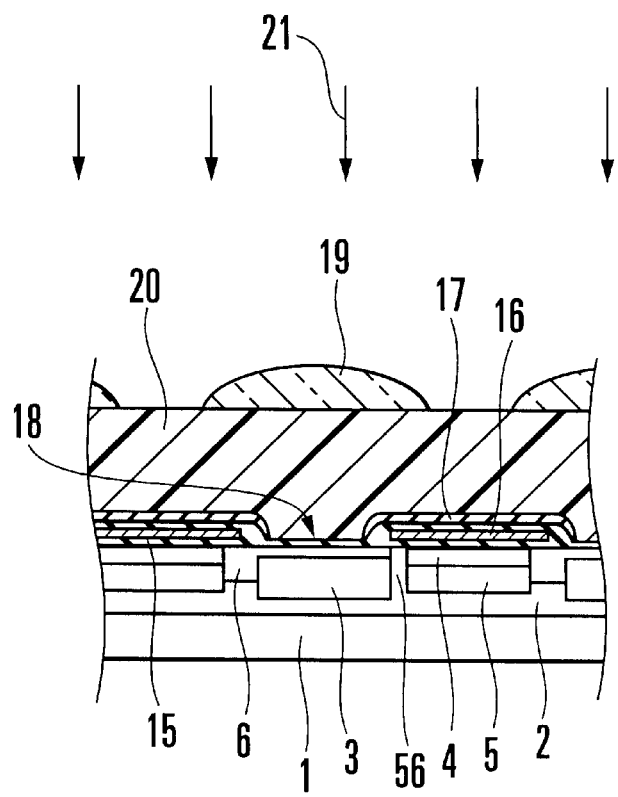
FIGS. 5A and 5B are sectional views taken along a line III—III in FIG. 4.
Figure 5B:
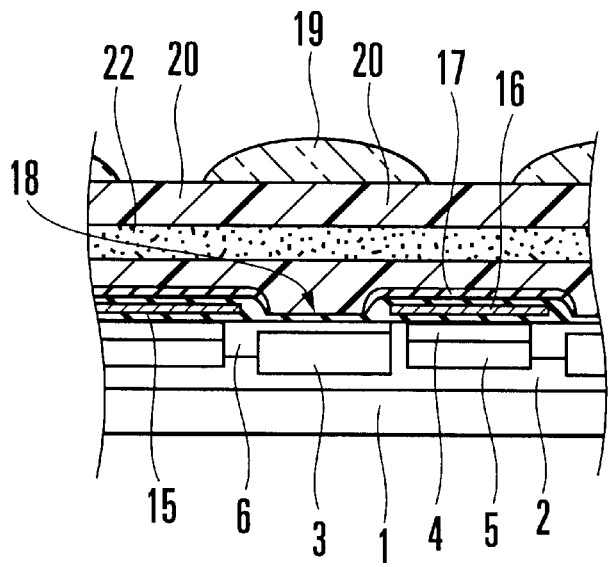
Figure 6A:
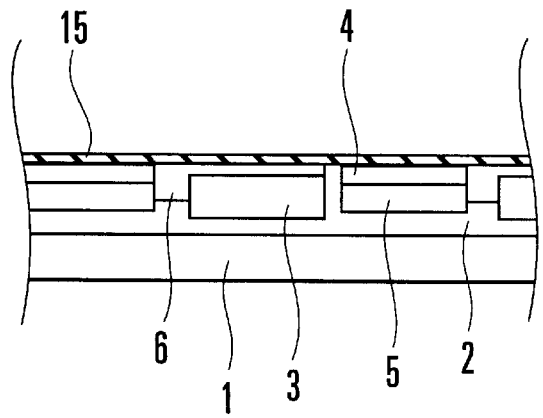
FIGS. 6A to 6E are sectional views showing a method of manufacturing a conventional CCD image sensing device having a microlens.
Figure 6B:
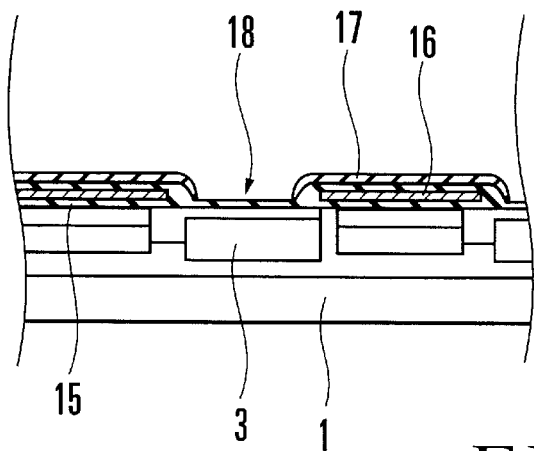
Figure 6C:
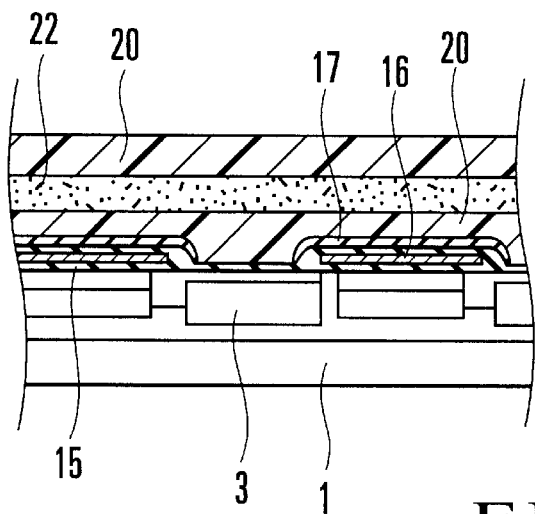
Figure 6D:
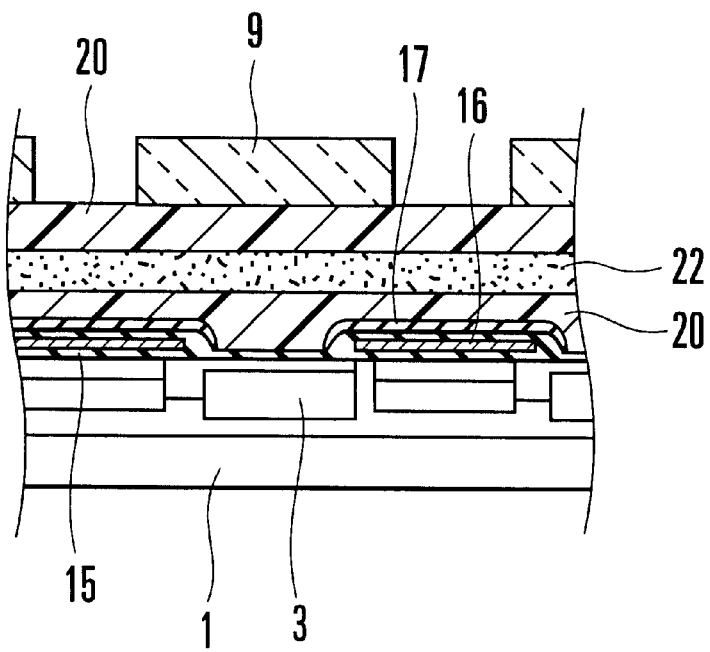
Figure 6E:
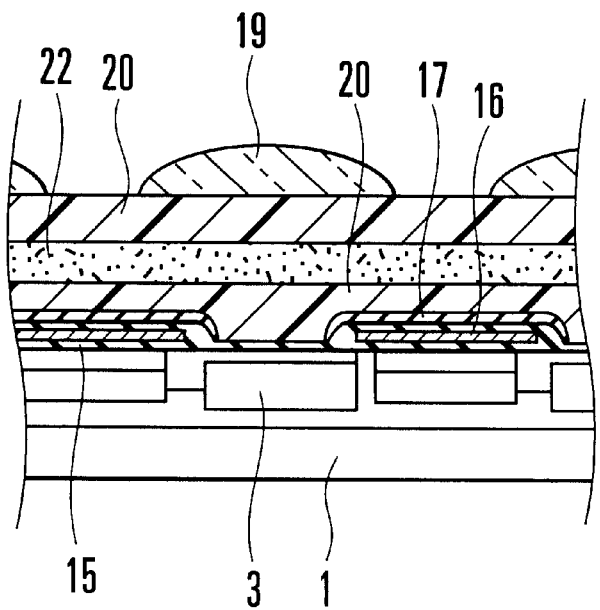

Next, thermal reflow is performed to work the resin pattern 109 into a microlens 119 having a convex lens shape, as shown in FIG. 3G. The microlens 119 may be or may not be formed in the monitor region. However, since the film thickness measuring pattern 141 is formed in order to measure the film thickness of the planarizing film, no microlens 119 is preferably formed in the monitor region for easy measurement.

Finally, with a process of removing the planarizing films 120*b* and 120*c* from the bonding pad (not shown) by etching, the planarizing film on the region 124 for film thickness measurement is simultaneously removed, thereby forming the film thickness measuring pattern 141 shown in FIG. 1B. Note that when the planarizing film on the regions 124 and 125 is removed, the film thickness measuring pattern 142 shown in FIG. 2B is obtained.

In the above-described processes shown in FIGS. 3B to 3F, the planarizing film thickness in each process can be measured using a film thickness meter having a probe. Since the film thickness measuring pattern in the monitor region is the same as that in the image sensing region, an accurate value is obtained unlike estimation from the coated film thickness of a planarizing film measured on a monitor substrate or the like.

In the above embodiments, an interline transfer CCD image sensing device has been exemplified as a solid-state image sensing device, though it may be any other image sensing device. For example, the present invention can be applied to any other device such as a frame interline transfer CCD, full-frame transfer CCD, MOS image sensor, CMOS image sensor, or active pixel image sensor, as long as it has a microlens formed on a photoelectric conversion element.

As has been described above, according to the present invention, the film thickness of the planarizing film of an on-chip microlens can be measured by a film thickness meter having a probe. Since the portion where the film thickness is measured is different from the image sensing region, the film thickness can be measured without destroying the image sensing device.

In addition, when the planarizing film has a film thickness different from the design value, the film thickness can be monitored in each process of manufacturing without actually driving the final product, so it can be determined at an early stage whether re-formation of the planarizing film is necessary. For this reason, the TAT in the manufacturing process can be minimized.

What is claimed is:

1. A solid-state image sensing device comprising:
   a semiconductor substrate having an image sensing region where elements including a plurality of photoelectric conversion elements are formed and a monitor region for film thickness measurement;
   an insulating film formed on an entire surface of said semiconductor substrate;
   an electrode/interconnection selectively formed in the image sensing region on said semiconductor substrate via said insulating film;
   a light-shielding film formed in the image sensing region on said electrode/interconnection via said insulating film, said light-shielding film having an opening corresponding to the photoelectric conversion element;
   a planarizing film formed in the image sensing region on said light-shielding film and insulating film;
   a microlens formed on said planarizing film in correspondence with the photoelectric conversion element and the opening of said light-shielding film; and
   a film thickness measuring pattern formed in the monitor region and including a first multilayered structure formed from said insulating film, electrode/interconnection, light-shielding film, and planarizing film,
   wherein the monitor region is formed from a first region and a second region adjacent to the first region, the first region having the first multilayered structure, and the second region having only said insulating film.

2. A device according to claim 1, wherein the monitor region further has a third region adjacent to the first region, the third region having said insulating film, electrode/interconnection, and light-shielding film.

3. A device according to claim 1, wherein the second region is arranged adjacent to both sides of the first region.

4. A device according to claim 1, wherein
   a diffusion layer constructing the element is formed in the image sensing region on said semiconductor substrate, and
   the diffusion layer constructing the element is not formed in the monitor region on said semiconductor substrate.

5. A device according to claim 1, further comprising a color layer formed in said planarizing film to extract incident light onto the photoelectric conversion element.

6. A solid-state image sensing device comprising:
   a semiconductor substrate having an image sensing region where elements are formed and a monitor region for layer thickness measurement,
   said monitor region including a first multilayered structure formed from the same layers on said semiconductor substrate as the layers of said image sensing region, and said image sensing region further including a microlens formed on said layers.
   wherein the monitor region comprises a first region including said first multilayered structure, and a second region including only insulating film on said substrate.

7. A solid-state image sensing device comprising:
   a semiconductor substrate having an image sensing region where elements, including a plurality of photoelectric conversion elements, are formed and a monitor region for layer thickness measurement;
   an insulating film formed on said semiconductor substrate;
   an electrode/interconnection selectively formed in the image sensing region on said semiconductor substrate via said insulating film;
   a planarizing film formed in the image sensing region on said insulating film; and
   a microlens formed on said substrate in correspondence with the photoelectric conversion element,
   said monitor region including a first multilayered structure formed from said insulating film, electrode/interconnection, and planarizing film,
   wherein the monitor region comprises a first region including said first multilayered structure, and a second region including only said insulating film on said substrate.

* * * * *